(12) United States Patent
Arndt et al.

(10) Patent No.: US 12,308,374 B2
(45) Date of Patent: May 20, 2025

(54) RADIATION-EMITTING COMPONENT AND METHOD FOR PRODUCING SAME

(71) Applicant: OSRAM Opto Semiconductors GmbH, Regensburg (DE)

(72) Inventors: Karlheinz Arndt, Bad Abbach (DE); Tobias Gebuhr, Bad Abbach (DE); Simon Jerebic, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 588 days.

(21) Appl. No.: 17/627,569

(22) PCT Filed: Jul. 29, 2020

(86) PCT No.: PCT/EP2020/071399
§ 371 (c)(1),
(2) Date: Jan. 14, 2022

(87) PCT Pub. No.: WO2021/018964
PCT Pub. Date: Feb. 4, 2021

(65) Prior Publication Data
US 2022/0263001 A1 Aug. 18, 2022

(30) Foreign Application Priority Data
Aug. 1, 2019 (DE) .................. 10 2019 211 550.0

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC ................... H01L 33/62; H01L 33/005; H01L 2933/0066; H01L 2224/16245;
(Continued)

(56) References Cited

U.S. PATENT DOCUMENTS 7,245,007 B1 7/2007 Foster
9,550,916 B2 * 1/2017 Yoshida .................. H01L 33/56
(Continued)

FOREIGN PATENT DOCUMENTS

DE 102008033018 A1 2/2010
DE 102010032512 A1 2/2012
(Continued)

OTHER PUBLICATIONS

International Search Report and Written Opinion issued in International Patent Application No. PCT/EP2020/071399 on Sep. 25, 2020.

*Primary Examiner* — Aaron J Gray
*Assistant Examiner* — Shawn Shaw Muslim
(74) *Attorney, Agent, or Firm* — ArentFox Schiff LLP (57) ABSTRACT

The invention relates to a housing for a radiation-emitting component, having the following features: —at least one electric contact point which is arranged on a first main surface of the housing and—at least one depression in the first main surface of the housing, said depression being arranged adjacently to the electric contact point. The invention additionally relates to a method for producing a radiation-emitting component and to a radiation-emitting component.

17 Claims, 7 Drawing Sheets

(58) Field of Classification Search
CPC ..... H01L 2933/0025; H01L 2933/0058; H01L 33/60; H01L 33/46
See application file for complete search history.

(56) References Cited

U.S. PATENT DOCUMENTS

| | | |
|---|---|---|
| 2008/0054287 A1 | 3/2008 | Oshio et al. |
| 2017/0054061 A1 | 2/2017 | Naka et al. |
| 2020/0227373 A1 | 7/2020 | Song et al. |

FOREIGN PATENT DOCUMENTS

| | | | |
|---|---|---|---|
| DE | 102013205894 A1 | | 10/2013 |
| DE | 102013224581 A1 | | 6/2015 |
| DE | 102018118697 A1 | | 2/2019 |
| EP | 2187457 A2 | | 5/2010 |
| JP | 2006135276 | * | 5/2006 |
| JP | 2006135276 A | | 5/2006 |
| WO | 2019054793 A1 | | 3/2019 |

\* cited by examiner

RADIATION-EMITTING COMPONENT AND METHOD FOR PRODUCING SAME

This application is a 35 U.S.C. § 371 National Phase of PCT Application No. PCT/EP2020/071399, filed on Jul. 29, 2020, which claims priority to German Patent Application No. 10 2019 211 550.0, filed Aug. 1, 2019, the disclosures of each of which are hereby incorporated by reference herein in their entireties.

A housing for a radiation-emitting component, a method for producing a radiation-emitting component, and a radiation-emitting component are specified.

A housing for a radiation-emitting component which enables an increased efficiency is intended to be provided. Moreover, a simplified method for producing a radiation-emitting component with increased efficiency, and a radiation-emitting component with increased efficiency are intended to be specified.

These objects are achieved in particular by means of a housing having the features of patent claim 1, by means of a method having the steps of patent claim 13, and by means of a radiation-emitting component having the features of patent claim 15.

The respective dependent claims relate to advantageous embodiments and developments of the housing, of the method and of the radiation-emitting component.

In accordance with a further embodiment, the housing comprises at least one electrical contact point arranged at a first main surface of the housing. The electrical contact point is configured to be electrically conductively connected to the electrical contact of a semiconductor chip, for example of a radiation-emitting semiconductor chip. Preferably, the electrical contact point of the housing is configured to be mechanically stably and electrically conductively connected to the electrical contact of the semiconductor chip by soldering. In particular, a contact surface of the electrical contact point is preferably embodied as solderable.

In accordance with a further embodiment, the housing comprises at least one depression in the first main surface, said at least one depression being arranged next to the electrical contact point. Preferably, the depression is embodied as a trough having a bottom surface running parallel to a mounting surface of the housing in places or over the entire bottom surface.

In accordance with one embodiment of the housing, side walls extend around the first main surface in a framelike fashion, such that a cavity is formed, wherein the first main surface of the housing comprises or forms a bottom surface of the cavity. Preferably, the side walls are embodied in a continuous fashion and form a closed frame, for example having a rectangular shape. Preferably, the electrical contact point is arranged in a manner adjoining one of the side walls. If the side walls form a rectangular shape, then the housing generally comprises four side walls. Two side walls in each case lie opposite one another here.

Preferably, inner surfaces of the side walls are arranged obliquely with respect to the bottom surface of the cavity. In this way, the inner surfaces of the side walls act as a reflector for electromagnetic radiation of a radiation-emitting semiconductor chip arranged in the cavity.

In accordance with a further embodiment, the housing comprises two electrical contact points arranged directly next to one another at the first main surface of the housing. The term "directly next to one another" is taken to mean, in particular, that no depression is arranged between the two electrical contact points. However, the two electrical contact points are generally arranged at a distance from one another.

By way of example, the two electrical contact points are separated from one another by a transverse web of an H-shaped spacer, which is described in detail further below.

It is possible for the housing to have any desired number of electrical contact points, i.e. for example two or more contact points. In the present case, features and embodiments are often described only for one electrical contact point, for the sake of simplicity. Such embodiments and features can be embodied for all electrical contact points of the housing.

If the housing comprises two electrical contact points arranged directly next to one another at the first main surface of the housing, then the housing preferably furthermore comprises two depressions at the first main surface of the housing. Here, preferably, one depression in each case is arranged next to an electrical contact point. In particular, the two electrical contact points are preferably arranged centrally at the first main surface of the housing. If the housing comprises a cavity around which side walls extend in a framelike fashion, wherein the first main surface forms the bottom surface of the cavity, then each depression preferably adjoins one side wall, which preferably lie opposite one another.

It is possible for the housing to have any desired number of depressions, i.e. for example two or more depressions. In the present case, features and embodiments are often described only for one depression, for the sake of simplicity. Such embodiments and features can be embodied for all depressions of the housing.

In accordance with a further embodiment, the housing has a main direction of extent. The depressions preferably adjoin two opposite side walls, each running transversely with respect to the main direction of extent of the housing.

In accordance with a further embodiment of the housing, a bottom surface of the depression is arranged vertically at a distance from a contact surface of the electrical contact point. The term "vertically at a distance" is taken to mean, in particular, that the bottom surface of the depression is at a distance from the contact surface of the electrical contact point in a vertical direction. In this case, the vertical direction is perpendicular to the mounting surface of the housing.

For example, the distance between the bottom surface of the depression and the contact surface of the electrical contact point has a value of between 20 micrometers and 200 micrometers inclusive, in particular approximately 50 micrometers.

In accordance with a further embodiment, the housing comprises an H-shaped spacer having two longitudinal webs, between which a transverse web is arranged. In other words, the longitudinal webs and the transverse web form the shape of the letter H. The transverse web preferably runs between the two electrical contact points. If the housing comprises a cavity around which side walls extend in a framelike fashion, wherein the first main surface forms the bottom surface of the cavity, then the longitudinal webs particularly preferably run along opposite side walls of the housing.

In accordance with a further embodiment of the housing, a gap is formed between the transverse web and the longitudinal web of the H-shaped spacer. Particularly preferably, in this case, the transverse web and the longitudinal web are completely separated from one another by the gap.

In accordance with a further embodiment, the housing comprises a housing body and a leadframe. The leadframe is preferably embedded into the housing body, wherein at least the contact surface of the electrical contact point is exposed at the first main surface of the housing. By way of example, the housing body is formed by molding from a housing material such as an epoxy mold compound (abbreviated to EMC).

The leadframe preferably comprises a metal or is formed from a metal. By way of example, the leadframe comprises copper or is formed from copper. Particularly preferably, the leadframe comprises a core formed from copper and provided with a coating. The coating preferably comprises silver or is formed from silver.

In accordance with a further embodiment of the housing, the depression is formed in the housing body. Furthermore, it is also possible for the depression to be formed in the leadframe.

In accordance with a further embodiment of the housing, the electrical contact point is part of the leadframe. Particularly preferably, the electrical contact point is connected to the rest of the leadframe by a joint web, wherein the joint web has a smaller thickness than the electrical contact point. By way of example, the joint web has a thickness which is between 0.3 times the thickness of the electrical contact point and 0.7 times the thickness of the electrical contact point inclusive. The joint web has the advantage that the radiation-emitting semiconductor chip secured on the electrical contact point experiences thermomechanical load relief. Particularly in the case of cyclic thermal loadings of the finished radiation-emitting component, the outer part of the leadframe is advantageously largely decoupled mechanically from the electrical contact points by the joint webs, such that only little mechanical stress is transmitted to the radiation-emitting semiconductor chip on the electrical contact points.

Preferably, the contact surface of the electrical contact point is delimited by the housing body, particularly preferably in a circumferentially extending fashion. By way of example, a surface of the housing body terminates flush with the contact surfaces. In this case, the housing body encloses the contact surfaces for example in a lateral direction. The lateral direction is perpendicular to the vertical direction.

The contact surface of the electrical contact point is particularly preferably provided for being mechanically stably and electrically conductively connected to the electrical contact of a radiation-emitting semiconductor chip by means of a solder. If the contact surface of the electrical contact point is delimited by the housing body, then during the soldering process molten solder particularly preferably remains on the contact surfaces on account of the different wetting properties of the housing body and the contact surface. This advantageously results in a robust soldering process.

In accordance with a further embodiment of the housing, the leadframe has an external electrical connection point, which is exposed at the mounting surface of the housing and has an indentation arranged at an edge of the housing. In this case, the edge delimits the mounting surface of the housing. The indentation at the edge of the housing makes it possible advantageously to monitor the soldering process for securing the external electrical connection point on a further element, such as a connection carrier, for example.

The housing described here is suitable for being used in a method for producing a radiation-emitting component. Features and embodiments that are described only in connection with the housing in the present case can also be embodied for the method, and vice versa.

In accordance with one embodiment of the method for producing a radiation-emitting component, a housing is provided, as already described.

In accordance with a further embodiment of the method, a radiation-emitting semiconductor chip is secured on the electrical contact point. During operation, the radiation-emitting semiconductor chip emits electromagnetic radiation in a first wavelength range from a radiation exit surface. By way of example, the radiation-emitting semiconductor chip is a light-emitting diode chip.

In accordance with a further embodiment of the method, a liquid reflecting potting compound is introduced into the depression, such that the liquid reflecting potting compound flows from the depression under the radiation-emitting semiconductor chip. Preferably, the liquid reflecting potting compound is embodied such that it is diffusely reflective. The term "diffusely reflective" is taken to mean, in contrast to a specularly reflective element, in particular, that the diffusely reflective element reflects incident electromagnetic radiation in many different spatial directions rather than only in a few.

By way of example, the liquid diffusely reflective potting compound comprises a resin, such as a silicone, for instance, into which diffusely reflective particles are introduced. The diffusely reflective particles are titanium dioxide particles, for example. Particularly preferably, the liquid diffusely reflective potting compound appears white.

In accordance with one preferred embodiment of the method, a rear-side main surface of the radiation-emitting semiconductor chip projects over the depressions. In this way, the liquid reflecting potting compound can flow under the semiconductor chip particularly well. While the liquid reflecting potting compound flows under the radiation-emitting semiconductor chip, a level of the liquid reflecting potting compound in the depression generally drops, such that a wetting angle of the liquid reflecting potting compound at side surfaces of the radiation-emitting semiconductor chip decreases. As the wetting angle decreases, the attempt by the liquid reflecting potting compound to wet the side surfaces of the radiation-emitting semiconductor chip decreases as well.

In accordance with one particularly preferred embodiment of the method, the liquid reflecting potting compound flows under the radiation-emitting semiconductor chip proceeding from the depression on account of capillary forces. After being introduced, the liquid reflecting potting compound preferably initially completely fills the depression. By way of example, the liquid reflecting potting compound is introduced into the depression by dispensing. In this case, for example, a drop forms within the depression.

The liquid reflecting potting compound in one depression preferably serves as a reservoir for the process of filling the first main surface of the housing. Proceeding from the depression at the first main surface, the liquid reflecting potting compound wets the region below the radiation-emitting semiconductor chip, flows around the electrical contacts and spreads further as far as the opposite depression. If the housing comprises a cavity around which side walls extend in a framelike fashion, wherein the first main surface forms the bottom surface of the cavity, then the inner surfaces of the side walls of the cavity are also generally wetted to a certain height by the liquid reflecting potting compound.

Particularly preferably, the radiation-emitting semiconductor chip is secured on the electrical contact point before the liquid reflecting potting compound is introduced in the depression of the housing.

In accordance with one embodiment of the method, the housing has two electrical contact points arranged directly next to one another at the first main surface of the housing.

In this case, the housing additionally preferably has two depressions in the first main surface, wherein one depression in each case is arranged next to an electrical contact point. If the housing comprises a cavity around which side walls extend in a framelike fashion, wherein the first main surface forms the bottom surface of the cavity, each depression preferably adjoins one side wall in each case.

In this embodiment of the method, the radiation-emitting semiconductor chip is particularly preferably embodied as a flip-chip. A flip-chip generally comprises a carrier having a first main surface, onto which a semiconductor layer sequence with a radiation-generating active zone is epitaxially grown or transferred. The semiconductor layer sequence is based on an arsenide or phosphide compound semiconductor material, for example. Arsenide compound semiconductor materials are compound semiconductor materials containing arsenic, such as the materials from the system $In_xAl_yGa_{1-x-y}As$ where $0 \leq x \leq 1$, $0 \leq y \leq 1$ and $x+y \leq 1$, while phosphide compound semiconductor materials are compound semiconductor materials containing phosphorus, such as the materials from the system $In_xAl_yGa_{1-x-y}P$ where $0 \leq x \leq 1$, $0 \leq y \leq 1$ and $x+y \leq 1$.

Preferably, the semiconductor layer sequence is based on a nitride compound semiconductor material. Nitride compound semiconductor materials are compound semiconductor materials containing nitrogen, such as the materials from the system $In_xAl_yGa_{1-x-y}N$ where $0 \leq x \leq 1$, $0 \leq y \leq 1$ and $x+y \leq 1$.

The carrier is generally transmissive at least to the electromagnetic radiation generated in the active zone. By way of example, the carrier comprises one of the following materials or is formed from one of the following materials: sapphire, silicon carbide. The carrier has a second main surface situated opposite the first main surface. The second main surface of the carrier generally partly forms the radiation exit surface of the semiconductor chip. Furthermore, the side surfaces of the carrier generally also form a part of the radiation exit surface of the flip-chip. Generally two electrical contacts are arranged at the rear-side main surface of the flip-chip, said electrical contacts being provided for electrically contacting the flip-chip. Particularly preferably, the rear-side main surface of the flip-chip is reflectively coated.

The flip-chip is preferably secured by its two electrical contacts on the electrical contact points of the housing, for example by soldering.

If a housing having two electrical contact points and two depressions is used in combination with a flip-chip, then this embodiment of the method is distinguished in particular by the fact that the liquid reflecting potting compound, proceeding from the depression into which it is introduced, flows under the flip-chip to the opposite depression. In this case, side surfaces of the flip-chip generally remain free of the liquid reflecting potting compound, such that the efficiency of the finished radiation-emitting component is not reduced owing to back-reflections.

The depressions at the first main surface of the housing make it possible advantageously to fill the entire cavity with the liquid reflecting potting compound up to a certain filling level in a simple manner. Furthermore, in the region of the depressions, in particular, a comparatively thick layer of liquid reflecting potting compound forms, which advantageously increases the efficiency of the finished radiation-emitting component.

In accordance with one preferred embodiment of the method, the transverse web of the H-shaped spacer has rounded corners. In this way, the liquid reflecting potting compound can flow under the semiconductor chip better.

Particularly preferably, edges of the depression are embodied in a rounded fashion. This, too, makes it easier for the liquid reflecting potting compound to flow under the semiconductor chip.

In accordance with one particularly preferred embodiment, the liquid reflecting potting compound is cured to form a solid potting. If the liquid reflecting potting compound is a liquid diffusely reflective potting compound, then the solid potting is also a diffusely reflective potting. This method step can be the last method step.

A radiation-emitting component can be produced by the method described. The embodiments and features described in association with the method can also be embodied for the radiation-emitting component, and vice versa.

In accordance with one embodiment, the housing comprises at least one electrical contact point arranged at a first main surface of the housing, and at least one depression in the first main surface of the housing. In this case, the depression is arranged next to the electrical contact point.

In accordance with a further embodiment, the radiation-emitting component comprises a radiation-emitting semiconductor chip with an electrical contact applied to the electrical contact point of the housing. Preferably, the electrical contact is electrically conductively and mechanically stably secured on the electrical contact by means of a solder. Preferably, the radiation-emitting semiconductor chip is a flip-chip.

The electrical contact point of the housing is preferably situated in the center of the first main surface of the housing. Accordingly, the radiation-emitting semiconductor chip is particularly preferably arranged centrally at the first main surface of the housing.

Particularly preferably, a rear-side main surface of the radiation-emitting semiconductor chip projects over the depression.

In accordance with a further embodiment, the radiation-emitting component comprises a potting arranged under the radiation-emitting semiconductor chip and in the depression. Particularly preferably, the potting is a diffusely reflective potting. The diffusely reflective potting is preferably a silicone into which titanium dioxide particles are introduced. The potting preferably forms a thickness of between 20 micrometers and 1000 micrometers inclusive on the bottom surface of the depression.

In accordance with one embodiment of the radiation-emitting component, the housing comprises a cavity around which side walls extend in a framelike fashion. Particularly preferably, a bottom surface of the cavity of the housing is completely covered with the potting.

In accordance with a further embodiment of the radiation-emitting component, the potting extends as far as a rear-side main surface of the radiation-emitting semiconductor chip.

In accordance with one preferred embodiment of the radiation-emitting component, the housing comprises an H-shaped spacer having two longitudinal webs, between which a transverse web is arranged. In this case, the transverse web preferably runs between the two electrical contact points. In this embodiment of the radiation-emitting component, the radiation-emitting semiconductor chip preferably bears by a rear-side main surface on at least one longitudinal web and/or the transverse web. In this way, the semiconductor chip can be secured particularly well at a defined distance from the electrical contact point.

Particularly preferably, a gap is formed between the transverse web and the longitudinal web of the H-shaped spacer. In the course of the liquid reflecting potting compound being introduced and flowing around the radiation-emitting semiconductor chip, said gap advantageously acts as a venting slot, such that air bubbles in the potting can advantageously be minimized. Moreover, the reflective potting compound can flow particularly well from one side of the semiconductor chip under the latter through to the other side of the semiconductor chip.

In accordance with a further embodiment, the radiation-emitting component comprises a conversion element, which converts electromagnetic radiation in the first wavelength range into electromagnetic radiation in a second wavelength range, which is different than the first wavelength range. An outer surface of the conversion element particularly preferably terminates flush with the housing, thereby forming a planar surface situated opposite the mounting surface of the radiation-emitting component. The conversion element is arranged in the cavity, for example. By way of example, the conversion element completely fills the cavity. By way of example, the conversion element comprises a potting compound such as a silicone into which phosphor particles are introduced.

The housing, the method for producing the radiation-emitting component, and the radiation-emitting component are based in particular on the concept described below.

The reflective potting on the first main surface of the housing increases the efficiency of the radiation-emitting component since the reflective potting generally reflects significantly more electromagnetic radiation of the semiconductor chip than metal surfaces of the leadframe or the surfaces of housing materials from which the housing body is generally formed.

In particular, the use of the described housing having the depression in the described method advantageously makes it possible to provide the bottom edges of the side walls arranged in a manner extending around the cavity, the regions under the radiation-emitting semiconductor chip and the regions at the edges of the radiation-emitting semiconductor chip with the potting in a simple manner, such that the efficiency of the finished radiation-emitting component is advantageously increased. A covering of the bottom edges of the side walls extending around the cavity is often necessary in particular since the bottom edges have metallic regions which are necessary when molding the housing body around the leadframe, but can reduce the efficiency of the radiation-emitting component.

The depression at the first main surface of the housing furthermore makes it possible to arrange a comparatively thick layer of the reflective potting at the first main surface of the housing. The depression in the first main surface of the housing has the further advantageous effect that during the process of introducing the liquid reflecting potting compound, the side surfaces of the radiation-emitting semiconductor chip are wetted with the liquid reflecting potting compound only slightly or not at all.

Moreover, with the use of a housing without a depression in the first main surface, the liquid reflecting potting compound generally runs upward at the side surfaces of the semiconductor chip, thus resulting in a reduced efficiency of the radiation-emitting component owing to back-reflections in the radiation-emitting semiconductor chip.

The radiation-emitting component is used for example in automotive applications and display backlights.

Further advantageous embodiments and developments of the housing, of the method for producing a radiation-emitting component, and of the radiation-emitting component will become apparent from the exemplary embodiments described below in association with the figures.

With reference to the schematic illustrations in FIGS. 1 to 7, a housing in accordance with one exemplary embodiment is explained in greater detail.

With reference to the schematic sectional illustrations in FIGS. 8 to 13, a method for producing a radiation-emitting component in accordance with one exemplary embodiment is explained in greater detail.

The schematic illustrations in FIGS. 14 and 15 show a radiation-emitting component in accordance with one exemplary embodiment.

The schematic illustrations in FIGS. 16 and 17 show a radiation-emitting component in accordance with a respective further exemplary embodiment.

Elements that are identical, of identical type or act identically are provided with the same reference signs in the figures. The figures and the size relationships of the elements illustrated in the figures among one another should not necessarily be regarded as to scale. Rather, individual elements, in particular layer thicknesses, may be illustrated with an exaggerated size in order to afford a better illustration and/or in order to afford a better understanding.

The housing 1 in accordance with the exemplary embodiment in FIGS. 1 to 7 comprises a housing body 2, into which a leadframe 3 is embedded. The housing body 2 is formed from an epoxy mold compound, for example, while the leadframe 3 comprises a metal.

Figure 1:
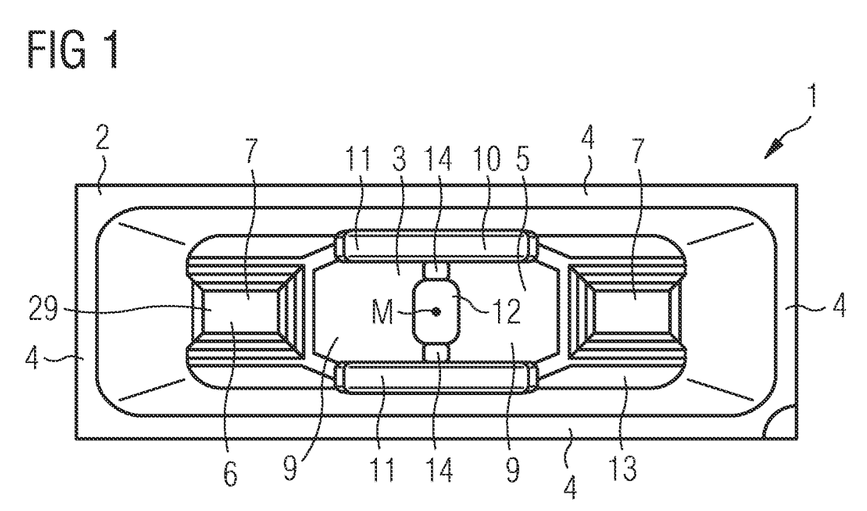

The housing 1 has a first main surface 6, in which two depressions 7 are arranged. In the present case, the housing 1 has side walls 4 delimiting a cavity 5 in a framelike fashion. The side walls 4 have a rectangular shape. The first main surface of the housing 1 forms a bottom surface of the cavity (FIG. 1). In this case, the depressions 7 have the shape of a trough. In the case of the present exemplary embodiment, the depressions 7 are embodied identically. In particular, the housing in accordance with the exemplary embodiment in FIG. 1 is embodied point-symmetrically with respect to a center point M.

The leadframe 3 has two electrical contact points 8, the contact surfaces 9 of which are shown in plan view in FIG. 1. The electrical contact points 8 are arranged centrally in the cavity 5 of the housing 1. Laterally with respect to each electrical contact point 8, a depression 7 is introduced in the first main surface 6 of the housing 1. Each of the depressions 7 adjoins opposite side walls 4 of the housing 1. The depressions 7 have a bottom surface 29, which are at a distance vertically relative to the contact surfaces 9 of the electrical contact points. In the present case, the bottom surface 29 of the depressions 7 is lowered with respect to a mounting surface 19 of the housing 1.

Figure 5:
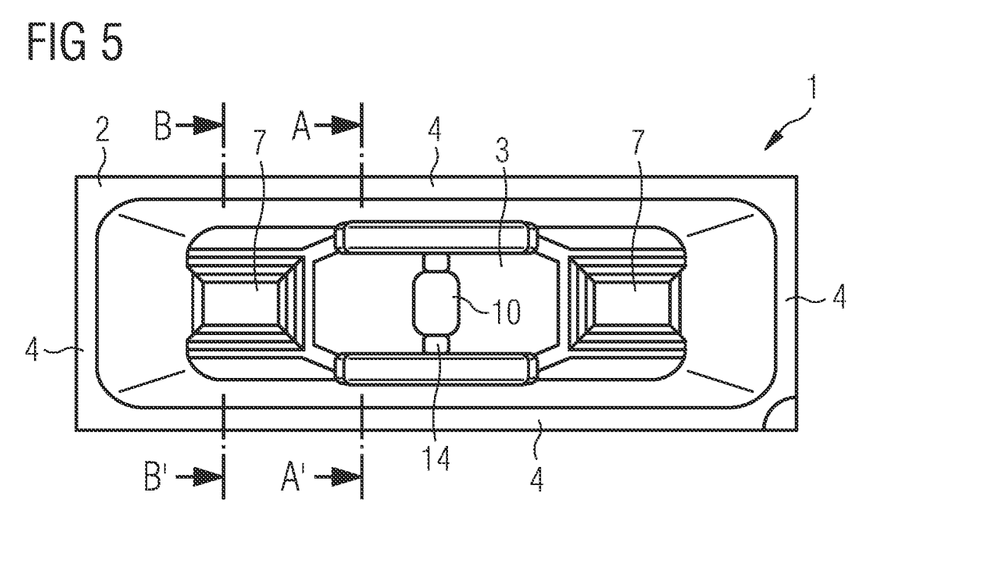

Moreover, in the present case, the housing body comprises an H-shaped spacer 10 having two longitudinal webs 11, between which a transverse web 12 is arranged. In this case, the transverse web 12 runs between the two electrical contact points 8. The longitudinal webs 11 run along two opposite side walls 4. The depicted H-shaped area in the plan view of the housing 1 in accordance with FIG. 5 schematically elucidates the shape of the H-shaped spacer 10.

In the case of the present exemplary embodiment, the depressions 7 are formed in the housing body 2. The bottom edges of the side walls 4 of the housing body 2 furthermore comprise metallic regions 13 that are necessary when molding the housing body 2 around the leadframe 3 for process engineering reasons.

A respective gap 14 is arranged between the transverse web 12 and the two longitudinal webs 11 of the H-shaped spacer 10. In other words, surfaces of the transverse web 12 and of the longitudinal webs 11 lie in a common plane, while in the region of the two gaps 14 the surface is lowered in the direction of the bottom surface of the cavity 6. Furthermore, corners of the transverse web 12 are embodied in a rounded fashion.

Figure 2:
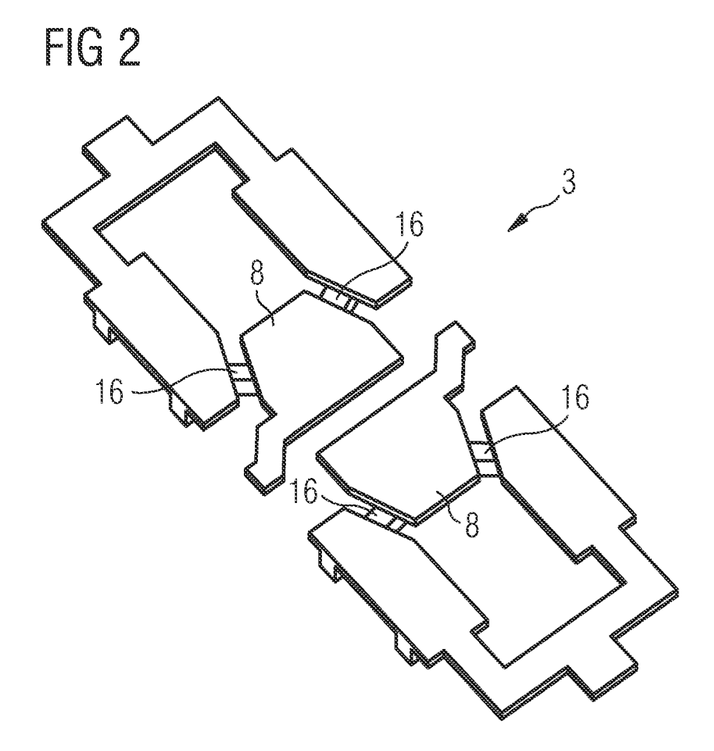
Figure 3:
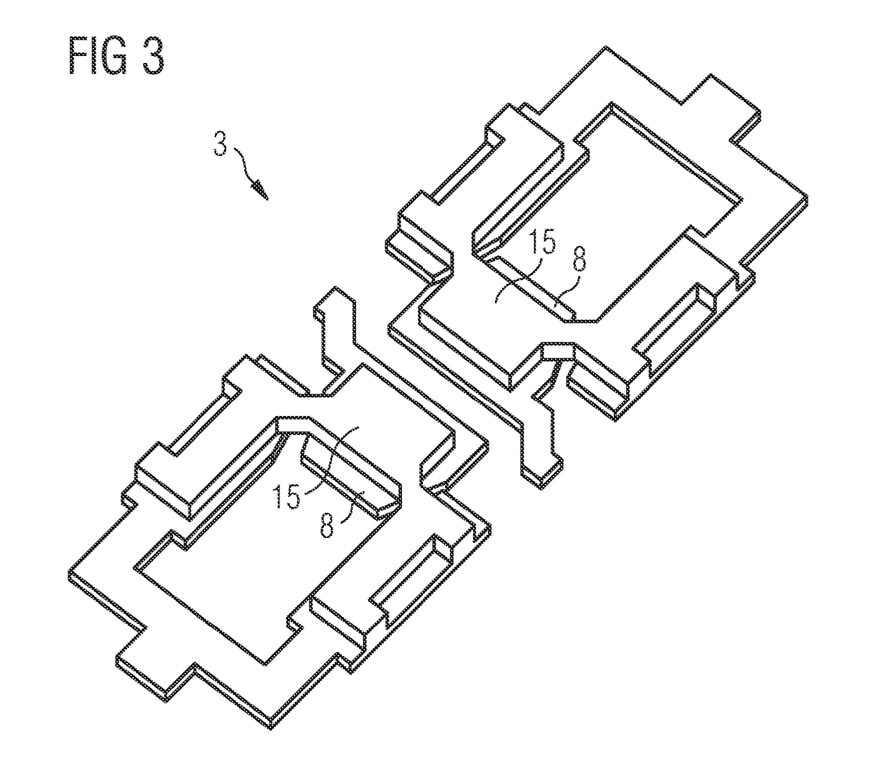

FIGS. 2 and 3 show schematic perspective views of the leadframe 3 embedded into the housing body 2. The leadframe 3 comprises for example a copper core provided with a silver coating.

FIG. 2 shows a front-side main surface of the leadframe 3 with the contact surfaces 9 of the electrical contact points 8, while FIG. 3 illustrates an opposite rear-side main surface of the leadframe 3. At the rear-side main surface the leadframe 3 has external electrical connection points 15, which are exposed at a mounting surface 18 of the housing 1.

Each electrical contact point 8 is mechanically connected to the rest of the leadframe 3 by a joint web 16. The joint web 16 has a smaller thickness than the electrical contact point 8. By way of example the joint web 16 has approximately half the thickness of the electrical contact point 8.

Figure 4:
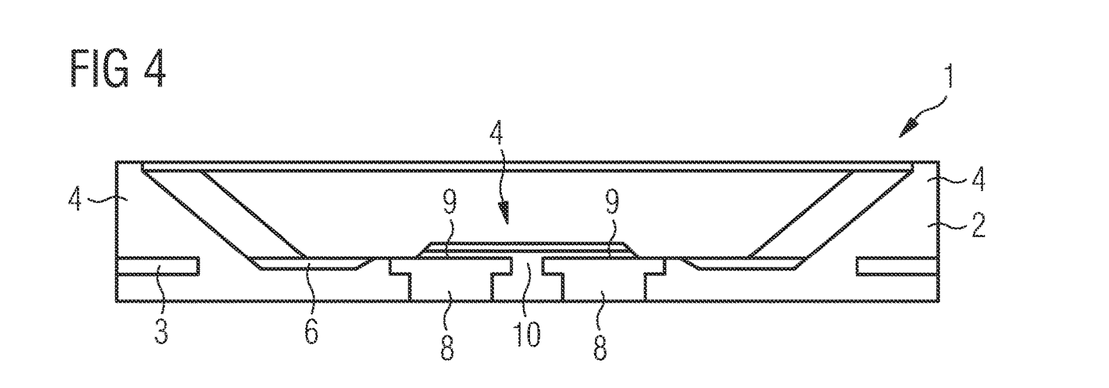

As shown by the sectional view of the housing 1 in FIG. 4, the electrical contact points 8 are embedded into the housing body 2 in such a way that the contact surfaces 9 of the electrical contact points 8 are delimited by the housing body 2.

Figure 6:
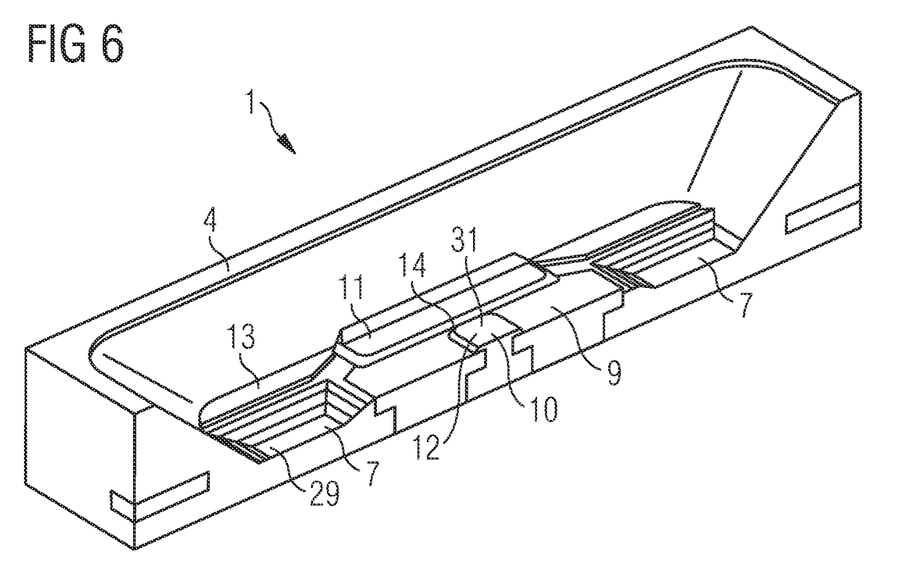

The transverse web 12 of the H-shaped spacer 10 projects beyond the contact surfaces 9 of the electrical contact points 8 in a vertical direction and forms a pedestal 31 for a radiation-emitting semiconductor chip to be mounted (see also FIG. 6).

The side walls 4 framing the cavity 5 have a chamfer in order to form a reflector for the electromagnetic radiation of a radiation-emitting semiconductor chip 17 in the cavity 5. The depressions 7 are arranged at a distance from the contact surfaces 9 of the electrical contact points 8 in a vertical direction.

Figure 7:
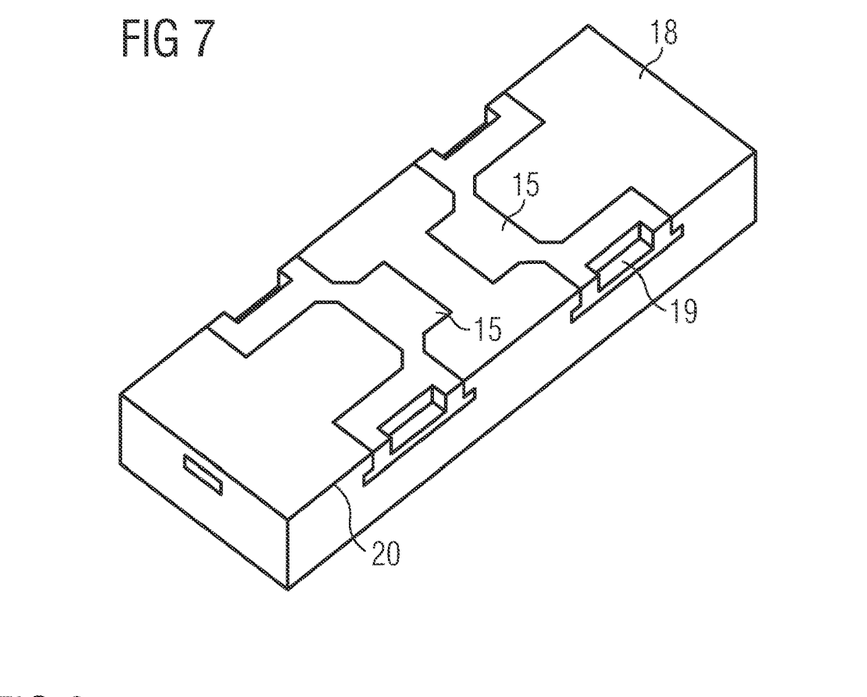

FIG. 7 shows the mounting surface 18 of the housing 1 in accordance with the present exemplary embodiment. The rear-side main surface of the leadframe 3 such as has been described with reference to FIGS. 2 and 3 is partly exposed at the mounting surface 18 of the housing 1. In particular, external electrical connection points 15 are exposed at the mounting surface 18. The external electrical connection points 15 furthermore have indentations 19 arranged at the edges 20 of the housing 1. The indentations 19 are provided for monitoring a soldering process by which the housing 1 is secured on a further element, such as a connection carrier, for example, at a later point in time.

Figure 8:
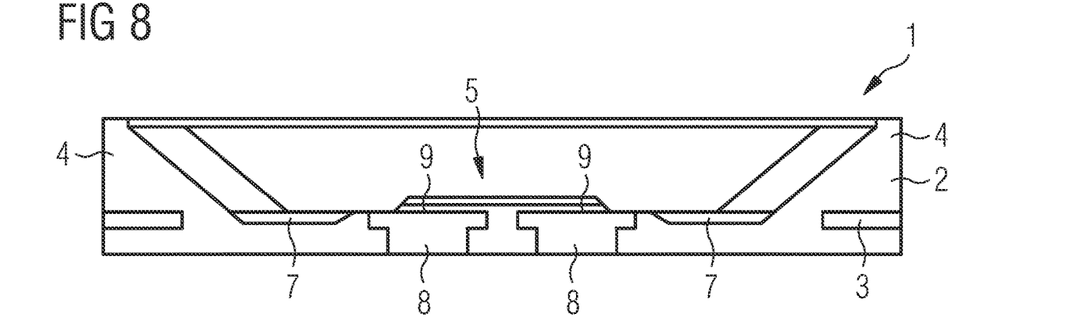
Figure 9:
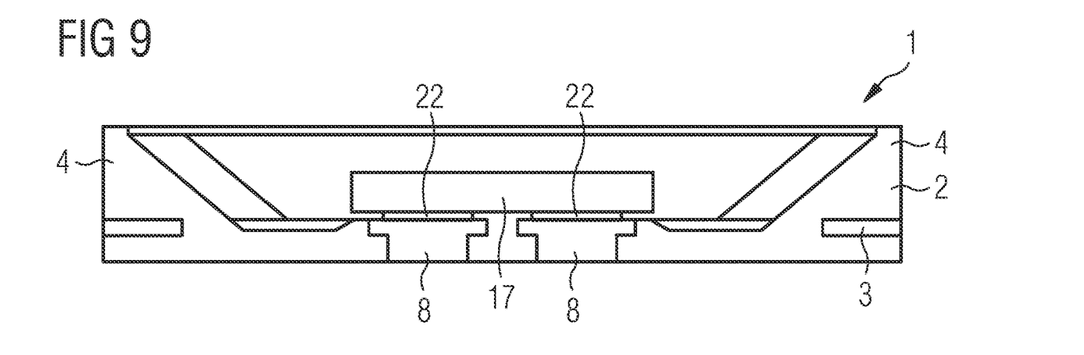

In the method in accordance with the exemplary embodiment in FIGS. 8 to 13, firstly a housing 1 is provided, such as has already been described with reference to FIGS. 1 to 7 (FIG. 8).

In a next step, a radiation-emitting semiconductor chip 17 embodied as a flip-chip is secured by both electrical contacts 21 onto the contact surfaces 9 of the electrical contact points 8 by means of a solder 22.

Figure 10:
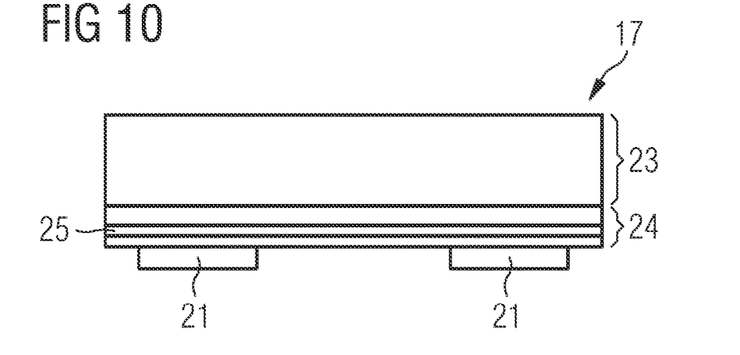

The flip-chip 17 is shown in the schematic sectional illustration in FIG. 10. The flip-chip 17 comprises a carrier 23, to which an epitaxial semiconductor layer sequence 24 is applied. The epitaxial semiconductor layer sequence 24 has an active zone 25, which generates electromagnetic radiation in a first wavelength range during operation. Two electrical contacts 21 for energizing the flip-chip 17 are arranged at a rear-side main surface of the flip-chip 17.

In the present case, the epitaxial semiconductor layer sequence 24, and in particular the active zone 25, is based on a nitride compound semiconductor material, while the carrier 23 is formed from sapphire. The active zone 25 generates blue light during operation, said blue light being emitted through the carrier 23.

Figure 11:
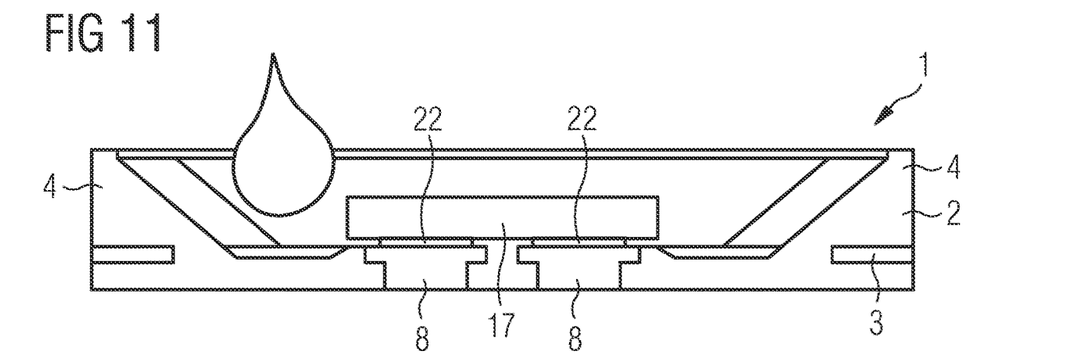

After the radiation-emitting semiconductor chip 17 has been secured on the contact surfaces 9, a liquid reflecting potting compound 26 is introduced into one of the depressions 7 of the housing 1, for example by dispensing (FIG. 11). In the present case, the liquid reflecting potting compound 26 is a silicone into which titanium dioxide particles are introduced. In the present case, the liquid reflecting potting compound 26 is embodied as diffusely reflective.

The liquid reflecting potting compound 26 fills the depression and forms a drop there. The depression 7 with the liquid reflecting potting compound 26 serves as a reservoir for the process of wetting the first main surface 6 of the housing 1. Proceeding from the depression 7 into which the liquid reflecting potting compound 26 is introduced, the reflective potting compound 26 flows from the depression 7 under the flip-chip 17 to the opposite depression 7 on account of capillary forces. Moreover, the side walls 4 of the cavity 5 are wetted with the liquid reflecting potting compound 26.

Figure 12:
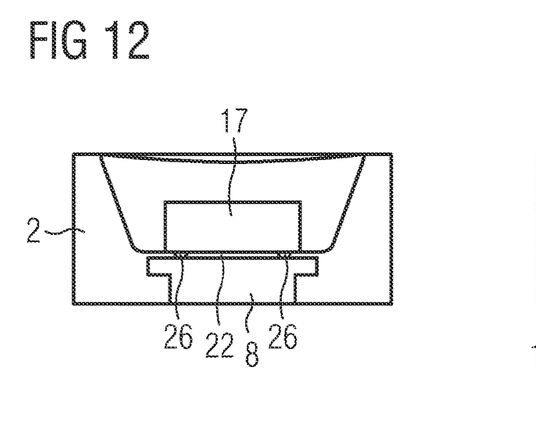
Figure 13:
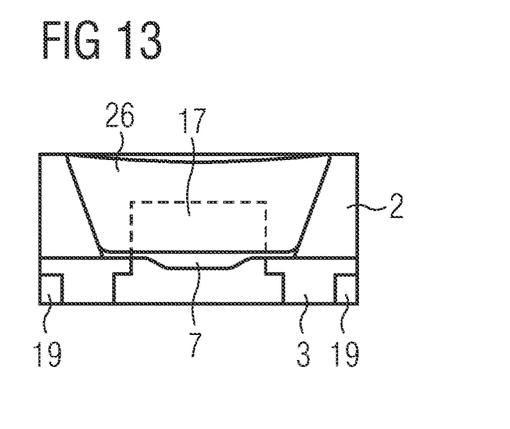

FIG. 12 shows a schematic sectional illustration of the housing 1 during the process of filling with the liquid reflecting potting compound 26 along the line AA' from FIG. 5, while FIG. 13 shows a schematic sectional illustration of the housing 1 during the process of filling with the liquid reflecting potting compound 26 along the line BB' from FIG. 5.

On account of capillary forces, the liquid reflecting potting compound 26 creeps under the radiation-emitting semiconductor chip 17 and encloses the solder 22 used to secure the radiation-emitting semiconductor chip 17 on the contact surfaces 9 of the electrical contact points 8 (FIG. 12). Moreover, the liquid reflecting potting compound 26 flows up on account of the surface tension at the side walls 4 of the cavity 5 and thereby forms a trough in the center of the first main surface 6 of the housing 1. However, since the depression 7 is filled with the liquid reflecting potting compound 26, there arises in this region, too, a comparatively thick, highly reflective layer of the liquid reflecting potting compound 26 (FIG. 13).

The liquid reflecting potting compound 26 is cured to form a solid reflective potting 27 (not illustrated).

Figure 14:
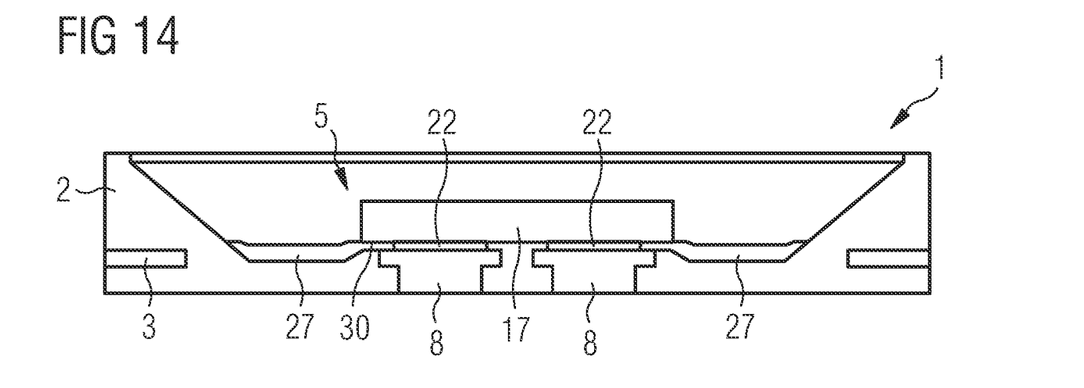
Figure 15:
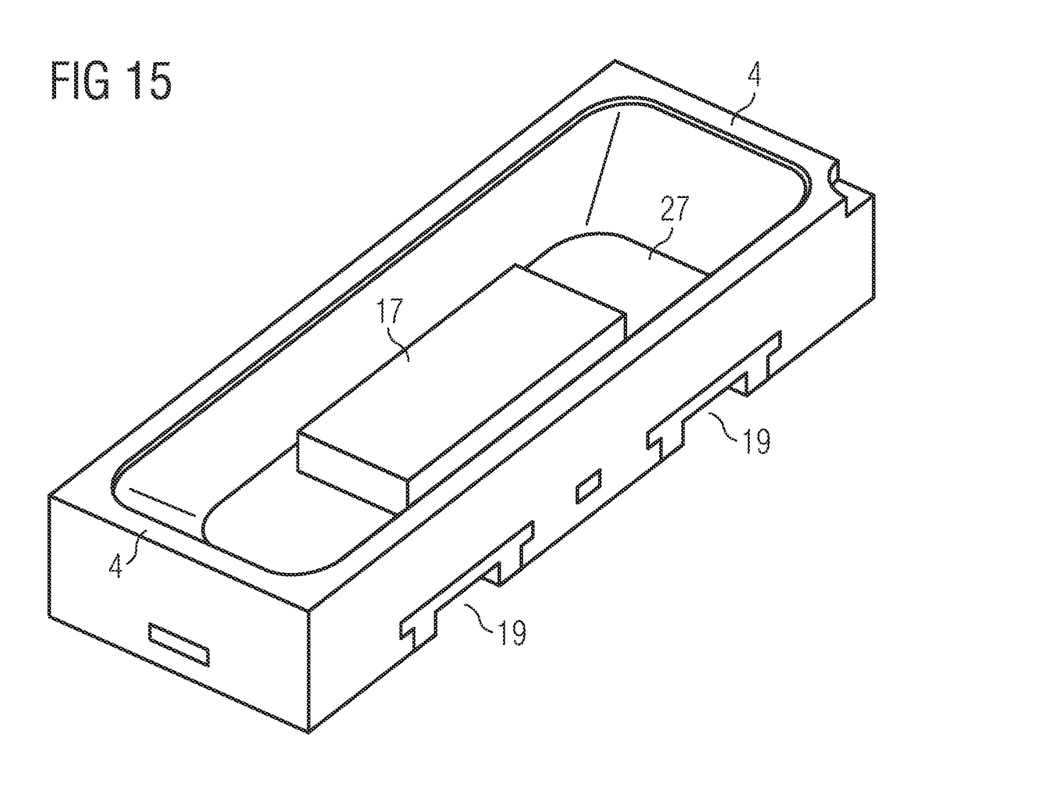

The radiation-emitting component in accordance with the exemplary embodiment in FIGS. 14 and 15 comprises a housing 1 having a housing body 2, into which a leadframe 3 is introduced. The housing 1 has already been described with reference to FIGS. 1 to 7, for example. The radiation-emitting semiconductor chip 17, which is embodied as a flip-chip 17 in the present case, is electrically conductively and mechanically stably connected by two rear-side electrical contacts 21 to a respective contact surface 9 of an electrical contact point 8 by means of a solder 22 (FIG. 14).

The housing 1 has a first main surface 6, into which two depressions 7 are introduced. In the present case, the housing 1 has a cavity 5 enclosed by side walls 4 in a framelike fashion. The first main surface 6 of the housing comprises a bottom surface 6 of the cavity 5.

The depressions 7 are completely filled with a reflective potting 27, which extends right under a rear-side main surface of the radiation-emitting semiconductor chip 17. The reflective potting 27 reaches as far as a rear-side main surface 30 of the radiation-emitting semiconductor chip 17. Between the electrical contact points 8 the housing 1 comprises an H-shaped spacer 10, on which the radiation-emitting semiconductor chip 17 is seated. In the present case, the H-shaped spacer 10 is part of the housing body 2.

As shown in FIG. 15, metallic regions 13 of the bottom edges of the side walls 4 of the cavity 5 which are necessary when molding the housing body 2 around the leadframe 3 are also completely covered by the reflective potting 27.

Figure 16:
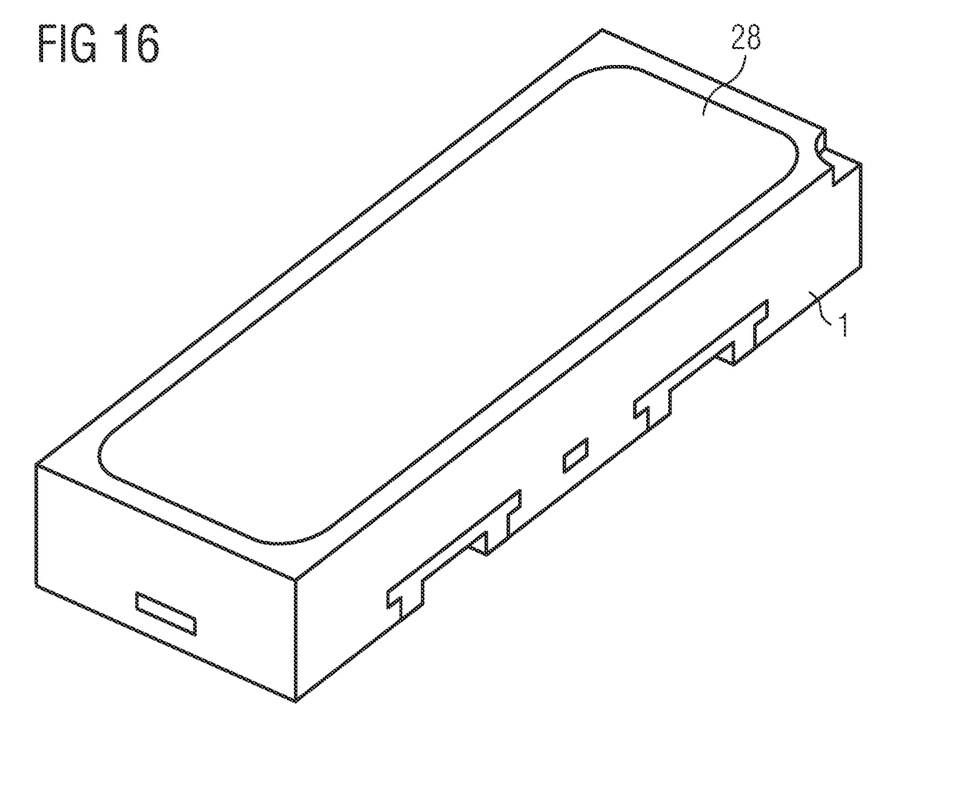

In comparison with the radiation-emitting component in accordance with the exemplary embodiment in FIGS. 14 and 15, the radiation-emitting component in accordance with the exemplary embodiment in FIG. 16 additionally comprises a conversion element 28, which converts electromagnetic radiation in the first wavelength range that is emitted by the radiation-emitting semiconductor chip 17 into electromagnetic radiation in a different wavelength range.

Figure 17:
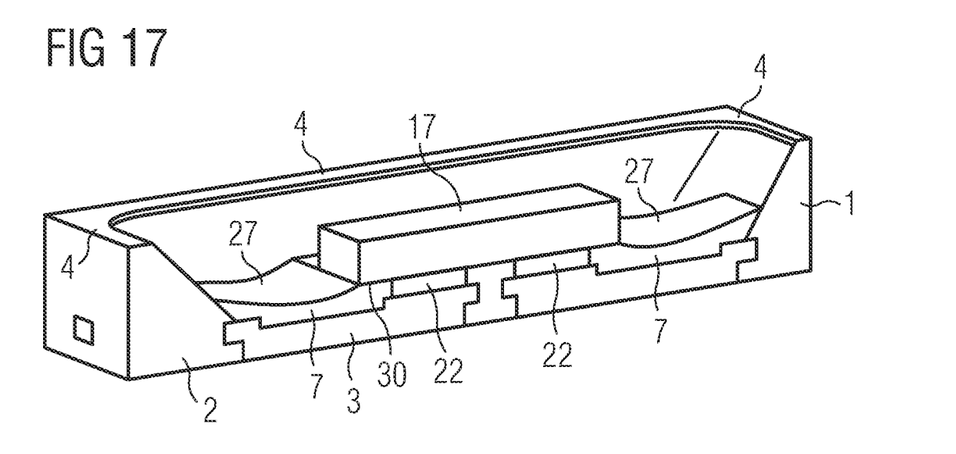

In contrast to the radiation-emitting component in accordance with the exemplary embodiment in FIGS. 14 and 15, the radiation-emitting component in accordance with the exemplary embodiment in FIG. 17 comprises a housing 1 in which the depressions 7 are introduced into the leadframe 3.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 Housing
2 Housing body
3 Leadframe
4 Side wall
5 Cavity
6 First main surface of the housing
7 Depression
8 Electrical contact point
9 Contact surface
10 H-shaped spacer
11 Longitudinal web
12 Transverse web
13 Metallic regions
14 Gap
15 External electrical connection point
16 Joint web
17 Semiconductor chip
18 Mounting surface
19 Indentation
20 Edge
21 Electrical contact
22 Solder
23 Carrier
24 Epitaxial semiconductor layer sequence
25 Active zone
26 Liquid reflecting potting compound
27 Solid reflective potting
28 Conversion element
29 Bottom surface of the depression
30 Rear-side main surface
31 Pedestal
M Center point

The invention claimed is:

1. A housing for a radiation-emitting component comprising:
at least one electrical contact point arranged at a first main surface of the housing,
at least one depression in the first main surface of the housing, said at least one depression being arranged next to the electrical contact point, and
a housing body and a leadframe embedded into the housing body, wherein a contact surface of the electrical contact point is exposed at the first main surface of the housing,
wherein the electrical contact point is connected to the rest of the leadframe by a joint web, wherein the joint web has a smaller thickness than the electrical contact point.

2. The housing as claimed in claim 1,
wherein side walls extend around the first main surface in a framelike fashion, such that a cavity is formed, wherein the first main surface of the housing comprises or forms a bottom surface of the cavity.

3. The housing as claimed in claim 1, comprising:
two electrical contact points arranged directly next to one another at the first main surface of the housing, and
two depressions at the first main surface of the housing, wherein
one of the depressions is arranged next to each electrical contact point.

4. The housing as claimed in claim 1,
wherein a bottom surface of the depression is arranged vertically at a distance from a contact surface of the electrical contact point.

5. The housing as claimed in claim 3, comprising:
an H-shaped spacer comprising two longitudinal webs, between which a transverse web is arranged, wherein the transverse web runs between the two electrical contact points.

6. The housing as claimed in claim 5, wherein
side walls extend around the first main surface in a framelike fashion, such that a cavity is formed,
wherein the first main surface of the housing comprises or forms a bottom surface of the cavity, and
the longitudinal webs run along opposite side walls.

7. The housing as claimed in claim 5,
wherein a gap is formed between the transverse web and the longitudinal web.

8. The housing as claimed in claim 1,
wherein at least one of the depressions is formed in the housing body.

9. The housing as claimed in claim 1,
wherein at least one of the depressions is formed in the leadframe.

10. The housing as claimed in claim 1,
wherein the contact surface of the electrical contact point is delimited by the housing body.

11. A method for producing a radiation-emitting component, comprising:
providing a housing, including:
at least one electrical contact point arranged at a first main surface of the housing, and
at least one depression in the first main surface of the housing, said at least one depression being arranged next to the electrical contact point,
securing a radiation-emitting semiconductor chip on the electrical contact point, wherein a rear-side main surface of the radiation-emitting semiconductor chip projects over the depression,
introducing a liquid reflecting potting compound into the depression, such that the liquid reflecting potting compound flows from the depression to underneath the semiconductor chip.

12. The method as claimed in claim 11,
wherein the liquid reflecting potting compound flows under the semiconductor chip proceeding from the depression on account of capillary forces.

13. The method of claim 11, wherein introducing the liquid reflecting potting comprises introducing the liquid reflecting potting such that the liquid reflecting potting compound flows from a first depression of the at least one depression through underneath the semiconductor chip to a second depression of the at least one depression.

14. A radiation-emitting component, comprising:
- a housing comprising at least one electrical contact point arranged at a first main surface of the housing, and at least one depression in the first main surface of the housing, said at least one depression being arranged next to the electrical contact point,
- a radiation-emitting semiconductor chip with an electrical contact applied to the electrical contact point, and
- a reflective potting arranged underneath the radiation-emitting semiconductor chip and in the depression, wherein
- a rear-side main surface of the radiation-emitting semiconductor chip projects over the depression.

15. The radiation-emitting component as claimed in claim 14,
- wherein the reflective potting extends as far as the rear-side main surface of the radiation-emitting semiconductor chip.

16. The radiation-emitting component as claimed in claim 14, wherein
- the housing comprises an H-shaped spacer having two longitudinal webs, between which a transverse web is arranged, wherein the transverse web runs between the two electrical contact points, and
- the radiation-emitting semiconductor chip bears by the rear-side main surface on at least one longitudinal web and/or the transverse web.

17. The radiation-emitting component of claim 14, further comprising a first depression of the at least one depression and a second depression of the at least one depression, wherein a liquid reflecting potting compound is configured to flow from the first depression through underneath the semiconductor chip to the second depression.

* * * * *